(12) United States Patent
Ito et al.

(10) Patent No.: US 8,338,074 B2
(45) Date of Patent: Dec. 25, 2012

(54) ACTINIC RADIATION-CURABLE STEREOLITHOGRAPHIC RESIN COMPOSITION HAVING IMPROVED STABILITY

(75) Inventors: Takashi Ito, Kanagawa (JP); Tsuneo Hagiwara, Kanagawa (JP); Hideki Kimura, Kyoto (JP); Masashi Date, Kyoto (JP); Jiro Yamamoto, Kyoto (JP)

(73) Assignees: CMET Inc., Kanagawa (JP); San-Apro Ltd., Kyoto (JP)

( * ) Notice: Subject to any disclaimer, the term of this patent is extended or adjusted under 35 U.S.C. 154(b) by 0 days.

(21) Appl. No.: 10/562,098

(22) PCT Filed: Jun. 24, 2004

(86) PCT No.: PCT/JP2004/009276
§ 371 (c)(1),
(2), (4) Date: Dec. 21, 2005

(87) PCT Pub. No.: WO2004/113396
PCT Pub. Date: Dec. 29, 2004

(65) Prior Publication Data
US 2007/0060682 A1    Mar. 15, 2007

(30) Foreign Application Priority Data

Jun. 25, 2003   (JP) ................. P2003-180470

(51) Int. Cl.
G03F 7/004 (2006.01)
G03F 7/027 (2006.01)
G03F 7/029 (2006.01)
C08G 59/68 (2006.01)

(52) U.S. Cl. ............ 430/270.1; 430/280.1; 430/281.1; 430/914; 430/916; 430/921; 430/925; 522/15

(58) Field of Classification Search ........... 430/270.1, 430/280.1, 281.1, 285.1, 914, 921, 925, 916; 264/401; 522/15, 17, 25, 31, 100, 104, 169, 522/170, 150, 153, 154, 157
See application file for complete search history.

(56) References Cited

U.S. PATENT DOCUMENTS

| | | | | |
|---|---|---|---|---|
| 4,694,029 A | * | 9/1987 | Land ............................... | 522/8 |
| 5,639,413 A | * | 6/1997 | Crivello ......................... | 264/401 |
| 5,639,802 A | * | 6/1997 | Neckers et al. ................. | 522/25 |
| 5,702,846 A | * | 12/1997 | Sato et al. ........................ | 430/2 |
| 5,776,634 A | * | 7/1998 | Ohkuma et al. ................. | 430/2 |
| 5,783,358 A | * | 7/1998 | Schulthess et al. ........... | 430/269 |
| 6,099,787 A | * | 8/2000 | Melisaris et al. ............. | 264/401 |
| 6,350,403 B1 | | 2/2002 | Melisaris et al. | |
| 6,379,866 B2 | * | 4/2002 | Lawton et al. ............... | 430/280.1 |
| 2003/0149124 A1 | * | 8/2003 | Thommes et al. ............. | 522/75 |
| 2004/0030158 A1 | * | 2/2004 | Date et al. ....................... | 549/62 |
| 2004/0137368 A1 | * | 7/2004 | Steinmann ................. | 430/280.1 |
| 2005/0148679 A1 | * | 7/2005 | Chiu et al. ....................... | 522/6 |

FOREIGN PATENT DOCUMENTS

| | | |
|---|---|---|
| JP | 52-14277 | 4/1977 |
| JP | 52-14278 | 4/1977 |
| JP | 52-14279 | 4/1977 |
| JP | 56-144478 A | 11/1981 |
| JP | 60-247515 A | 12/1985 |
| JP | 62-35966 A | 2/1987 |
| JP | 2-113925 A | 4/1990 |
| JP | 2-153722 A | 6/1990 |
| JP | 3-41126 A | 2/1991 |
| JP | 7-103218 A | 11/1995 |
| JP | 8-224790 A | 9/1996 |
| JP | 8-259614 A | 10/1996 |
| JP | 10-87810 A | 4/1998 |
| JP | 11-310626 A | 11/1999 |
| JP | 2002-241363 A | 8/2002 |
| JP | 2002-256062 A | 9/2002 |
| WO | WO 02/48101 | * 6/2002 |

* cited by examiner

Primary Examiner — Anca Eoff
(74) Attorney, Agent, or Firm — Panitch Schwarze Belisario & Nadel LLP

(57) ABSTRACT

It is intended to provide the following resin composition for stereolithography which is superior in storage stability and aging stability during operation, shows no increase in viscosity upon prolonged storage, has a high light-curing sensitivity and, therefore, makes it possible to produce, upon photo irradiation, an object by stereolithography, which is superior in dimensional accuracy, fabricating accuracy, water resistance, moisture resistance and mechanical properties at a high fabricating speed and a high productivity. A resin composition for stereolithography which is an actinic radiation-curable resin composition containing a cationic-polymerizable organic compound, a radical-polymerizable organic compound, a photo cationic polymerization initiator and a photo radical polymerization initiator, in which the photo cationic polymerization initiator contains a compound represented by the following formula (I) and having a purity of 80% or higher:

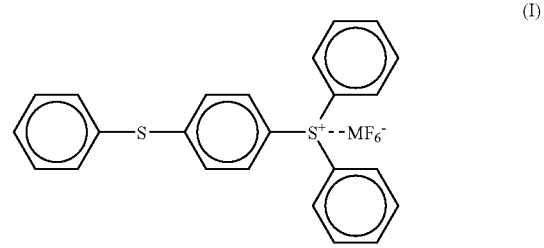

(I)

wherein M represents an antimony atom or a phosphorus atom; and the broken line between $S^+$ and $MF_6^-$ represents an ionic bond.

4 Claims, No Drawings

ACTINIC RADIATION-CURABLE STEREOLITHOGRAPHIC RESIN COMPOSITION HAVING IMPROVED STABILITY

CROSS-REFERENCE TO RELATED APPLICATION

This application is a section 371 of International Application No. PCT/JP2004/009276, filed Jun. 24, 2004, which was published in the Japanese language on Dec. 29, 2004, under International Publication No. WO 2004/113396 A1 and the disclosure of which is incorporated herein by reference.

TECHNICAL FIELD

This invention relates to an actinic radiation-curable resin composition for stereolithography. More specifically, it relates to an actinic radiation-curable stereolithographic resin composition, which is superior in storage stability and asing stability during operation, shows little increase in viscosity upon prolonged storage at a high temperature, and yet has a high cure sensitivity due to an actinic radiation such as light, thereby enabling the production, upon active irradiation, of a three-dimensional object by stereolithography superior in dimensional accuracy, fabricating accuracy, water resistance, moisture resistance and mechanical properties at a high fabricating speed and a high productivity.

BACKGROUND ART

In recent years, there has been widely employed the optical stereolithographic molding method of a liquid photo curable resin composition based on data put in three-dimensional CAD, since this method makes it possible to obtain a desired three-dimensional fabricated object at a high dimensional accuracy without preparing a die or the like (see, for example, Patent Documents 1 to 6).

A typical example of optical stereolithographic molding techniques (hereinafter optical stereolithographic molding will be sometimes called "stereolithography") is a method comprising selectively irradiating the liquid surface of a liquid photo curable resin in a container with an ultraviolet laser under computer control so as to give a desired pattern, curing the resin selectively at a thickness, providing a liquid resin corresponding to a single layer on the thus cured layer, curing it by irradiating with an ultraviolet laser in the same manner, and repeating the buildup procedure for obtaining cured layers to thereby give a three-dimensional object. This stereolithography is widely employed today, since an object in considerably complicated shape can be easily produced thereby within a relatively short period of time.

Resins or resin compositions to be used in the stereolithography should have various characteristics, for example, having a high cure sensitivity upon irradiation with an actinic radiation, a fabricated object having a favorable resolution and a high fabricating accuracy, having a low volume shrinkage after curing, a cured object having excellent mechanical properties, having a favorable self-adhesiveness, having favorable curing properties under oxygen atmosphere, having a low viscosity, being excellent in water resistance and moisture resistance, absorbing little water or moisture with the passage of time, being excellent in dimensional stability and so on.

As photo curable resin compositions for stereolithography, various photo curable resin compositions such as photo curable resin compositions containing a radical-polymerizable organic compound; photo curable resin compositions containing a cationic-polymerizable organic compound; and photo curable resin compositions containing both of a radical-polymerizable organic compound and a cationic-polymerizable organic compound have been proposed and used. Examples of the radical-polymerizable organic compound to be used in these cases include (meth)acrylate compounds, urethane (meth)acrylate compounds, polyester (meth)acrylate compounds, polyether (meth)acrylate compounds, epoxy (meth)acrylate compounds and so on, while examples of the cationic-polymerizable organic compound include various epoxy compounds, cyclic acetal compounds, thiirane compounds, vinyl ether compounds, lactones and so on.

A photo curable resin composition containing a cationic-polymerizable organic compound such as an epoxy compound, the cationic-polymerizable organic compound being one of the cited polymerizable compounds, reacts as follows. Namely, a photo initiator for cationic polymerization in a system forms a cationic species upon photo irradiation, and then the cationic species is included in a chain-reaction with the cationic-polymerizable organic compound to thereby cause a ring-opening reaction of the cationic-polymerizable organic compound. In the case of using a photo curable resin composition based on a cationic-polymerizable organic compound such as an epoxy compound, the obtained photo cured product has a smaller shrinkage and a fabricated object having a more favorable dimensional accuracy can be obtained in general, compared with the case of using a photo curable resin composition based on a radical-polymerizable organic compound.

On the other hand, it has been pointed out that it takes too long time to be molded since a photo curable resin composition base on a cationic-polymerizable organic compound such as an epoxy compound has a low reaction speed upon photo irradiation. To speed up the photo reaction speed, there have been proposed photo curable resin compositions containing radical-polymerizable organic compounds such as (meth)acrylate compounds together with the cationic-polymerizable organic compound (see, for example, Patent Document 7). In the case of using such a photo curable resin composition containing a cationic-polymerizable organic compound together with a radical-polymerizable organic compound, a fabricated object having a high dimensional accuracy can be obtained while shortening the photo curing time. Such a system is now called "hybrid type".

However, a photo curable resin composition containing a cationic-polymerizable organic compound such as an epoxy compound is insufficient in storage stability and aging stability during operation and sometimes shows an increase in viscosity during storage. At a high temperature, in particular, it suffers from a rapid increase in viscosity within a short period of time and loses liquidity. As a result, it is almost impossible to use the composition in stereolithography, etc. In a high temperature area or in the summer season, therefore, such a photo curable resin composition containing a cationic-polymerizable organic compound is required to be transported in a refrigerated state or stored in a cooled place, which causes difficulties in handling and cost. The same applies to photo curable resin compositions containing both of a cationic-polymerizable organic compound such as an epoxy compound and a radical-polymerizable organic compound.

To improve the storage stability of a photo curable resin composition containing a cationic-polymerizable organic compound, it has been proposed to add an aromatic tertiary amine or the like (see Patent Document 8). Although the storage stability of a photo curable resin composition can be improved by adding an aromatic tertiary amine or the like, there frequently arise undesirable secondary by effects, for example, decreasing in the photo sensitivity upon curing. Namely, this countermeasure is still not sufficient.

It is publicly known to use an onium salt as a photo initiator for cationic polymerization for photo polymerizing a cationic-polymerizable organic compound. There have been known photo polymerization initiators comprising, for example, aromatic sulfonium salts of the group VIIa elements (see Patent Document 9), aromatic onium salts of the group VIa elements (see Patent Document 10), aromatic onium salts of the group Va elements (see Patent Document 11) and so on. However, no attention is paid in any case to the improvement of the storage stability of a photo curable resin composition. As a photo polymerization initiator for a cationic-polymerizable organic compound, in particular, there has been marketed and employed a cationic polymerization initiator which contains a bissulfonium salt in a large amount of 50 weight % or more, i.e., containing the bissulfonium salt as the main component, the bissulfonium salt being represented by the following formula (II):

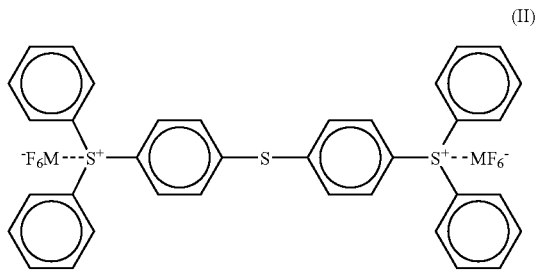

wherein M represents an antimony atom or a phosphorus atom; and the broken line between $S^+$ and $MF_6^-$ represents an ionic bond. Although a photo curable resin composition containing the existing cationic polymerization initiator containing a bissulfonium salt as the main component as described above is excellent in photo cure sensitivity, it is poor in storage stability and aging stability during operation and frequently shows an increase in viscosity during storage. At a high temperature, in particular, it suffers from a rapid increase in viscosity within a short period of time and becomes less fluid. As a result, it is almost impossible to use the composition in stereolithography, etc.

(Patent Document 1) JP-A-56-144478
(Patent Document 2) JP-A-60-247515
(Patent Document 3) JP-A-62-35966
(Patent Document 4) JP-A-2-113925
(Patent Document 5) JP-A-2-153722
(Patent Document 6) JP-A-3-41126
(Patent Document 7) JP-B-7-103218
(Patent Document 8) U.S. Pat. No. 6,350,403
(Patent Document 9) JP-B-52-14277
(Patent Document 10) JP-B-52-14278
(Patent Document 11) JP-B-52-14279
(Patent Document 12) JP-A-2002-241363

DISCLOSURE OF THE INVENTION

An object of the present invention is to provide an actinic radiation-curable resin composition for stereolithography, which contains a cationic-polymerizable organic compound such as an epoxy compound and a radical-polymerizable organic compound, and which is superior in storage stability and aging stability during operation in not using (for example, during storage or distribution), shows no or little increase in viscosity upon prolonged storage, in particular, shows little increase in viscosity upon prolonged storage at a high temperature, and is able to sustain such a fluid state as being usable in stereolithography.

Further, an object of the present invention is to provide an actinic radiation-curable resin composition for stereolithography having such a favorable storage stability and aging stability during operation as described above, while being superior in cure sensitivity with an actinic radiation and quickly curing upon active irradiation to thereby enable the production of an object by stereolithography, which is superior in resolution, fabricating accuracy, dimensional accuracy, mechanical properties, appearance and so on at a high fabricating speed and a high productivity.

To solve the above-described problems, the present inventors conducted intensive studies. As a result, they have found that, by using a specific monosulfonium salt represented by the following formula (I) and having a high purity of 80% or higher, preferably 90% or higher:

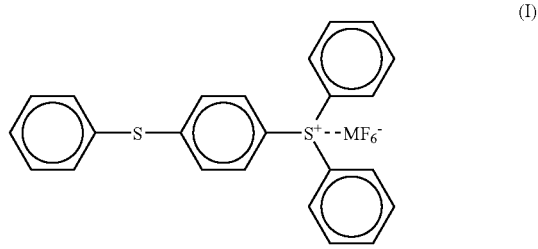

wherein M represents an antimony atom or a phosphorus atom; and the broken line between $S^+$ and $MF_6^-$ represents an ionic bond;

in an actinic radiation-curable resin composition for stereolithography containing a cationic-polymerizable organic compound, a radical-polymerizable organic compound, a photo initiator for cationic polymerization and a photo initiator for radical polymerization, the storage stability and aging stability during operation of the resin composition for stereolithography as described above are improved, and thus a composition which shows little increase in viscosity and sustains its liquidity, in particular, upon prolonged storage at a high temperature and, therefore, is effectively usable in stereolithography can be obtained. Moreover, it has been found that the above-described resin composition for stereolithography containing the compound represented by the above formula (I) as a photo initiator for cationic polymerization shows little decrease in cure sensitivity upon active irradiation and, therefore, use of this composition in stereolithography makes it possible to produce an object by stereolithography, which is superior in resolution, fabricating accuracy, dimensional accuracy, mechanical properties, appearance and so on at a high fabricating speed and a high productivity.

The present inventors have further found that, by adding a compound having oxetane group such as an oxetane monoalcohol compound and/or polyoxetane to the above-described resin composition for stereolithography containing the compound represented by the above formula (I) with a high purity as a photo initiator for cationic polymerization, the obtained composition shows a further improved cure sensitivity to an actinic radiation while sustaining favorable storage stability and aging stability during operation, and an aimed object by stereolithography can be produced within a shortened period of time by irradiating the composition with an actinic radiation, and that the dimensional accuracy in the stereolithography can be further improved thereby.

The present inventors have furthermore found that, by adding a polyalkylene ether compound to the above-described resin composition for stereolithography containing the compound represented by the above formula (I) with a high purity as a photo initiator for cationic polymerization, an object by stereolithography having further improved properties such as impact resistance can be obtained. The present invention has been completed based on these various findings.

Accordingly, the present invention provides:

(1) A resin composition for stereolithography, which is an actinic radiation-curable resin composition comprising a cationic-polymerizable organic compound, a radical-polymerizable organic compound, a photo initiator for cationic polymerization, and a photo initiator for radical polymerization, wherein the photo initiator for cationic polymerization comprises a compound represented by the following formula (I), the compound having a purity of 80% or higher:

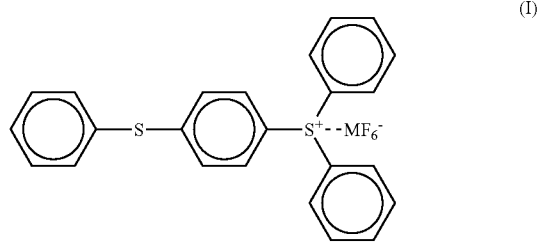

wherein M represents an antimony atom or a phosphorus atom; and the broken line between $S^+$ and $MF_6^-$ represents an ionic bond.

The present invention further relates to:

(2) The resin composition for stereolithography as described in the above (1), wherein the purity of the compound represented by the above formula (I) is 90% or higher;

(3) The resin composition for stereolithography as described in the above (1) or (2), wherein the purity of the compound represented by the above formula (I) is 95% or higher;

(4) The resin composition for stereolithography as described in any of the above (1) to (3), wherein M in the compound represented by the above formula (I) is an antimony atom;

(5) The resin composition for stereolithography as described in any of the above (1) to (4), wherein the cationic-polymerizable organic compound comprises at least one compound having an epoxy group; or (6) The resin composition for stereolithography as described in any of the above (1) to (5), wherein the radical-polymerizable organic compound comprises at least one compound having a (meth)acryl group.

The present invention furthermore relates to:

(7) The resin composition for stereolithography as described in any of the above (1) to (6), which comprises an oxetane compound at a ratio of from 1 to 30% by mass with respect to the mass of the cationic-polymerizable organic compound; or (8) The resin composition for stereolithography as described in any of the above (1) to (7), which comprises a polyalkylene ether compound at a ratio of from 1 to 30% by mass with respect to the mass of the cationic-polymerizable organic compound.

As described above, the resin composition for stereolithography according to the present invention, which contains a cationic-polymerizable organic compound such as an epoxy compound, a radical-polymerizable organic compound, a photo initiator for cationic polymerization and a photo initiator for radical polymerization and contains the compound (I) represented by the above formula (I) and having a purity of 80% or higher as the initiator for cationic polymerization, is superior in storage stability and aging stability during operation, shows no or little increase in viscosity upon prolonged storage, in particular, shows little increase in viscosity upon prolonged storage at a high temperature and can sustain such a fluid state as being usable in stereolithography over a long period of time.

While sustaining the favorable storage stability and aging stability during operation as described above, the resin composition for stereolithography according to the present invention has a superior cure sensitivity to an actinic radiation. Owing to this characteristic, it quickly cures upon active irradiation and thus enables the production of a three-dimensional object being superior in resolution, fabricating accuracy, dimensional accuracy, mechanical properties, appearance and so on at a high fabricating speed and a high productivity.

A composition prepared by further adding a compound having oxetane group such as an oxetane monoalcohol compound and/or polyoxetane to the above-described resin composition for stereolithography containing the compound represented by the above formula (I) as a photo initiator for cationic polymerization shows a further improved cure sensitivity to an actinic radiation while sustaining favorable storage stability and aging stability during operation and an aimed object by stereolithography can be produced within a shortened period of time by irradiating the composition with an actinic radiation.

In the case of stereolithography with the use of a composition prepared by adding a polyalkylene ether compound to the above-described resin composition for stereolithography containing the compound represented by the above formula (I) as a photo initiator for cationic polymerization, a three dimensional object having further improved properties such as impact resistance, in addition to the various superior properties as described above, can be obtained.

BEST MODE FOR CARRYING OUT THE INVENTION

Now, the present invention will be described in greater detail.

The resin composition for stereolithography according to the present invention is a resin composition which cures upon irradiation with an actinic radiation to form a three-dimensional object. It contains a cationic-polymerizable organic compound, a radical-polymerizable organic compound, a photo initiator for cationic polymerization and a photo initiator for radical polymerization.

The term "actinic radiation" as used herein means an energy beam capable of curing a resin composition for stereolithography such as ultraviolet ray, electron beam, X-ray or radial ray. Accordingly, the resin composition for stereolithography according to the present invention is a resin composition for stereolithography which cures upon irradiation with one or more actinic radiations as described above.

In the resin composition for stereolithography according to the present invention (hereinafter referred to as "resin composition for stereolithography"), a compound represented by the above formula (I) is employed as the photo initiator for cationic polymerization as described above (hereinafter sometimes referred to merely as "cationic polymerization initiator"). The compound (I) to be used as the cationic polymerization initiator in the present invention is an onium salt releasing a Lewis acid upon irradiation with the actinic radiation.

As described above, M in the formula (I) represents an antimony atom or a phosphorus atom, and the broken line between $S^+$ and $MF_6^-$ represents an ionic bond. Specific chemical names of the compound (I) include (4-phenylthiophenyl)diphenylsulfonium hexafluoroantimonate (M being an antimony atom) and (4-phenylthiophenyl)diphenylsulfonium hexafluorophosphate (M being a phosphorus atom). Either one or both of these compounds may be used in the present invention. Between these compounds, it is preferred to use (4-phenylthiophenyl)diphenylsulfonium hexafluoroantimonate, wherein M is an antimony atom, because of being superior in storage stability and aging stability during operation and being capable of giving a resin composition for stereolithography having a higher curing speed upon irradiation with the actinic radiation.

In the present invention, it is necessary to use the compound (I) having a purity of 80% or higher. In the case where the compound (I) employed as the cationic polymerization initiator has a purity lower than 80%, the resin composition for stereolithography containing the same has lowered storage stability and aging stability during operation and thus suffers from an increase in viscosity during storage or distribution, which makes it unsuitable for stereolithography.

From the viewpoints of the storage stability, the aging stability during operation and so on, it is preferable to use the compound (I) having a purity of 90% or higher, still preferably the compound (I) having a purity of 95% or higher and still preferably the compound (I) having a purity of 97% or higher.

The expression "the compound (I) having a purity of 80% or higher" as used herein indicates that, in the compound (I) to be used as the cationic polymerization initiator, the content of the pure compound (I) remaining after removing impurities amounts to 80% or higher. As the impurities contained in the compound (I), residual components of the starting materials employed in producing the compound (I), by-products formed together during the production of the compound (I), etc. may be cited. To improve the storage stability and handling properties of the compound (I) and homogeneously mix the compound (I) with the resin composition for stereolithography, it has been a practice to use the compound (I) in the state of being dissolved or dispersed in a solvent such as propylene carbonate or the like. In such a case, the solvent is excluded from the category of the impurities.

The compound (I) having a purity of 80% or higher, in particular, 90% or higher and a method of producing the same have been already known (see, for example, Patent Document 12 filed by the present inventors). The compound (I) having a purity of 80% or higher, in particular, 90% or higher can be smoothly produced by the above-described method reported in Patent Document 12 or the like. However, the method of producing the compound (I) having a purity of 80% or higher to be used in the present invention is not specifically restricted. Namely, the compound (I) may be produced by any method so long as it has a purity of 80% or higher, preferably 90% or higher, still preferably 95% or higher and still preferably 97% or higher.

Although the type of the residual components of the starting materials and the type of the by-products contained as impurities in the compound (I) vary depending on the method of producing the compound (I) and so on, it is frequently observed that a compound (bissulfonium salt) represented by the following formula (II) is simultaneously formed in producing the compound (I):

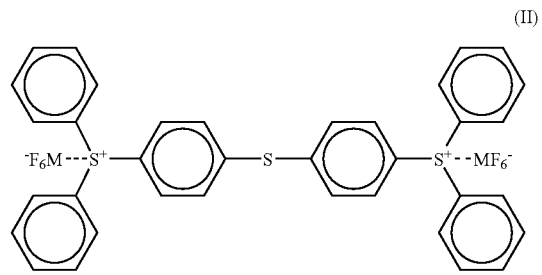

(II)

wherein M represents an antimony atom or a phosphorus atom; and the broken line between $S^+$ and $MF_6^-$ represents an ionic bond.

Therefore, the compound (I) frequently contains the compound represented by the above formula (II) (hereinafter sometimes referred to as "compound (II)". Specific chemical names of the compound (II) include bis-(4-(diphenylsulfonio)phenyl)sulfide bishexafluoroantimonate (M being an antimony atom) and bis-(4-(diphenylsulfonio)phenyl)sulfide bishexafluorophosphate (M being a phosphorus atom).

From the viewpoint of the storage stability and aging stability during operation of the resin composition for stereolithography according to the present invention, however, it is necessary that the total content of the impurities such as the above-described compound (II) and so on in the compound (I) to be used in the present invention is not more than 20% by mass, preferably not more than 10% by mass, still preferably not more than 5% by mass and still preferably not more than 3% by mass.

As described above, use has been made of cationic polymerization initiators comprising the compound (II) as the main component in resin composition for stereolithographys containing cationic-polymerizable organic compounds, etc. However, the compound (I) to be used as the cationic polymerization initiator in the resin composition for stereolithography according to the present invention contains no or a very small amount, if any, of the compound (II). Namely, the present invention largely differs in this point from the related art with the use of the cationic polymerization initiators comprising the compound (II) as the main component.

The compound (I) sometimes contains, as the components of the starting materials, diphenyl sulfoxide, acetonitrile, methanol and so on. From the viewpoint of preventing cure failure of the resin composition for stereolithography according to the present invention, it is preferable to lower the concentrations of these impurities in the cationic polymerization initiator. The concentration of diphenyl sulfoxide in the cationic polymerization initiator is preferably less than 0.05% by mass, still preferably less than 0.01% by mass. The concentration of aceonitrile in the cationic polymerization initiator is preferably less than 0.5% by mass, still preferably less than 0.1% by mass and particularly preferably less than 0.05% by mass. The concentration of methanol in the cationic polymerization initiator is preferably less than 1.0% by mass, still preferably less than 0.5% by mass.

It is preferred that the resin composition for stereolithography according to the present invention contains, as a cationic polymerization initiator, the compound (I) and having a purity of 80% or higher at a ratio of from 1 to 10% by mass, still preferably from 2 to 6% by mass, based on the total mass of the cationic-polymerizable organic compound and the radical-polymerizable organic compound.

Since the compound (I) generally occurs as a solid and cannot be homogeneously mixed into the resin composition for stereolithography, it is preferable to blend the compound (I) in the form of a solution by dissolving in a solvent. Examples of the solvent therefor include propylene carbonate, ethylene carbonate and so on. Among them, propylene carbonate can be preferably employed from the viewpoints of safety and odor-freeness because of having a high boiling point and being little volatile.

To enhance the reaction speed, the resin composition for stereolithography according to the present invention may further contain, if required, a photosensitizer, for example, a dialkoxyanthracene such as dibutoxyanthracene or thioxanthone together with the above-described cationic polymerization initiator.

As the cationic-polymerizable organic compound in the resin composition for stereolithography according to the present invention, any compound may be used so long as it can undergoes a cationic polymerization reaction and/or a cationic crosslinkage reaction when irradiated with an actinic radiation in the presence of the cationic polymerization initiator as described above.

Typical examples of the cationic-polymerizable organic compound usable in the present invention include epoxy compounds having epoxy groups, cyclic ether compounds, cyclic acetal compounds, cyclic lactone compounds, cyclic thioether compounds, spiroorthoester compounds, vinyl ether compounds and so on. In the present invention, either one or more of the cationic-polymerizable organic compounds as described above may be used.

Specific examples of the cationic-polymerizable organic compound usable in the present invention are as follows:

(1) epoxy compounds such as alicyclic epoxy resins, aliphatic epoxy resins and aromatic epoxy resins;

(2) trimethylene oxide, oxetane compounds such as 3,3-dimethyloxetane, 3,3-dichloromethyloxetane, 3-methyl-3-phenoxymethyloxetane and 1,4-bis((3-ethyl-3-oxetanyl-methoxy)methyl)benzene, oxolane compounds such as tetrahydrofuran and 2,3-dimethyltetrahydrofuran and cyclic ether or cyclic acetal compounds such as trioxane, 1,3-dioxolane and 1,3,6-trioxane cyclooctane;

(3) cyclic lactone compounds such as β-propiolactone and ε-caprolactone;

(4) thiirane compounds such as ethylene sulfide and thioepichlorohydrin;

(5) thiethane compounds such as 1,3-propyn sulfide and 3,3-dimethylthiethane;

(6) vinyl ether compounds such as ethylene glycol divinyl ether, alkyl vinyl ether, 3,4-dihydropyran-2-methyl (3,4-dihydropyran-2-carboxylate) and triethylene glycol divinyl ether;

(7) spiroorthoester compounds obtained by reacting an epoxy compound with a lactone; and (8) ethylenically unsaturated compounds such as vinyl cyclohexane, isobutylene and polybutadiene; and so on.

Among the above-described compounds, it is preferred to use a compound having epoxy group as the cationic-polymerizable organic compound. In the present invention, it is particularly preferable to use an alicyclic polyepoxy compound having two or more epoxy groups per molecule as the cationic-polymerizable organic compound. It is preferable that the above-described alicyclic compound amounts to from 30 to 99% by mass, in particular, from 50 to 90% by mass, of the cationic-polymerizable organic compound. By using a cationic-polymerizable organic compound containing the above-described alicyclic polyepoxy compound and the content of the alicyclic polyepoxy compound being 30 to 99% by mass, still preferably 50 to 90% by mass, it is possible to further improve the cationic polymerization speed, thick film curability, resolution, ultraviolet ray permeability and so on of the resin composition for stereolithography according to the present invention. In this case, moreover, the viscosity of the resin composition for stereolithography is lowered and, therefore, the actinic radiation-curing procedure can be smoothly carried out in the stereolithographic step. As a result, the resulting cured object (object by stereolithography) has a further lowered volume shrinkage.

Examples of the alicyclic epoxy resin which is preferably usable as described above include polyglycidyl ether of a polyhydric alcohol having at least one alicyclic ring, a cyclohexene oxide or cyclopentene oxide-containing compound obtained by epoxidizing a cyclohexne or cyclopentene ring-containing compound with an appropriate oxidizing agent such as hydrogen peroxide or a peracid, and so on. More specifically speaking, examples of the alicyclic epoxy resin include hydrogenated bisphenol A diglycidyl ether, 3,4-epoxycyclohexylmethyl-3,4-epoxycyclohexane carboxylate, 2-(3,4-epoxycyclohexyl-5,5-spiro-3,4-epoxy)cyclohexane-meth-dioxane, bis(3,4-epoxycyclohexylmethyl) adipate, vinylcyclohexene dioxide, 4-vinylepoxycyclohexane, bis(3, 4-epoxy-6-methylcyclohexylmethyl) adipate, 3,4-epoxy-6-methylcyclohexyl-3,4-epoxy-6-methylcyclohexane carboxylate, methylenebis(3,4-epoxycyclohexane), dicyclopentadiene diepoxide, di(3,4-epoxycyclohexylmethyl) ether of ethylene glycol, ethylenebis(3,4-epoxycyclohexane carboxylate), dioctyl epoxyhexahyrophthalate, di-2-ethylhexyl epoxyhexahydrophthalate and so on.

Examples of the above-described aliphatic epoxy resin usable as the cationic-polymerizable organic compound include homopolymers and copolymers of polyglycidyl ether of an aliphatic polyhydric alcohol or its alkylene oxide adduct and polyglycidyl ester, glycidyl acrylate or glycidyl methacrylate of an aliphatic long-chain polybasic acid and so on. More specifically speaking, examples thereof include diglycidyl ether of 1,4-butanediol, diglycidyl ether of 1,6-hexanediol, triglycidyl ether of glycerol, triglycidyl ether of trimethylolpropane, tetraglycidyl ether of sorbitol, hexaglycidyl ether of dipentaerythritol, diglycidyl ether of polyethylene glycol, diglycidyl ether of polypropylene glycol, polyglycidyl ether of a polyether polyol obtained by adding one or more alkylene oxides to an aliphatic polyhydric alcohol such as ethylene glycol, propylene glycol or glycerol, diglycidyl ether of an aliphatic long-chain dibasic acid and so on. In addition to the above-described epoxy compounds, citation may be made of, for example, monoglycidyl ether of an aliphatic higher alcohol, diglycidyl ether of a higher fatty acid, epoxidized soybean oil, butyl epoxystearate, octyl epoxystearate, epoxidized linseed oil, epoxidized polybutadiene and so on.

Examples of the above-described aromatic epoxy resin usable as the cationic-polymerizable organic compound include a mono- or polyglycidyl ether of a monohydric or polyhydric phenol having at least one aromatic nucleus or its alkylene oxide. More specifically speaking, examples thereof include mono- or diglycidyl ether bis phenol A or bisphenol F, a glycidyl ether other than diepoxy compounds obtained by an alkylene oxide adduct of bisphenol A or bisphenol F with epichlorohydrin, epoxy novolac resin, phenol, cresol butylphenol or monoglycidyl ether of a polyether alcohol obtained by adding an alkylene oxide thereto, and so on.

In the present invention, one or more epoxy compounds as described above as the cationic-polymerizable organic compound may be used. As described above, it is particularly preferred to employ epoxy compounds containing a polyepoxy compound having two or more epoxy groups per molecule at a ratio of 30% by mass or more based on the total mass of the cationic-polymerizable organic compounds.

As the radical-polymerizable organic compound to be used in the resin composition for stereolithography according to the present invention, use may be made of any compound undergoing a radical polymerization reaction and/or a crosslinkage reaction upon irradiation with an actinic radiation in the presence of a photo initiator for radical polymerization (hereinafter sometimes referred to merely as "radical polymerization initiator"). Typical examples thereof include compounds having (meth)acrylate group, unsaturated polyester compounds, allylurethane compounds, polythiol compounds and so on. Use can be made of one or more of the radical-polymerizable organic compounds as described above. Among them, it is preferable to use a compound having at least one (meth)acryl group. Specific examples thereof include a product of a reaction between an epoxy compound with (meth)acrylic acid, (meth)acrylic acid esters of alcohols, urethane(meth)acrylate, polyester (meth)acrylate, polyether (meth)acrylate and so on.

Examples of the above-described product of a reaction between an epoxy compound with (meth)acrylic acid include (meth)acrylate type reaction products obtained by reacting an aromatic epoxy compound, an alicyclic epoxy compound and/or an aliphatic epoxy compound with (meth)acrylic acid. Among the (meth)acrylate type reaction products as described above, (meth)acrylate type reaction products obtained by reacting an aromatic epoxy compound with (meth)acrylic acid are preferably employed. Specific examples thereof include (meth)acrylate obtained by reacting a glycidyl ether, which is obtained by reacting a bisphenol compound such as bisphenol A or bisphenol S or its alkylene oxide adduct with an epoxidizing agent such as epichlorohydrin, with (meth)acrylic acid, a (meth)acrylate type reaction product obtained by epoxy novolac resin with (meth)acrylic acid and so on.

Examples of the (meth)acrylic acid esters of alcohols as described above include (meth)acrylates obtained by reacting an aromatic alcohol, an aliphatic alcohol, an alicyclic alcohol and/or an alkylene oxide adduct thereof having at least one hydroxyl group per molecule with (meth)acrylic acid. More specifically speaking, examples thereof include 2-ethylhexyl (meth)acrylate, 2-hydroxyethyl(meth)acrylate, 2-hydroxypropyl(meth)acrylate, lauryl (meth)acrylate, stearyl (meth)acrylate, isooctyl (meth)acrylate, tetrahydrofurfuryl (meth)acrylate, isobornyl (meth)acrylate, benzyl (meth)acrylate, 1,4-butanediol di(meth)acrylate, 1,6-hexanediol di(meth)acrylate, diethylene glycol di(meth)acrylate, triethylene glycol di(meth)acrylate, neopentyl glycol di(meth)acrylate, polyethylene glycol di(meth)acrylate, polypropylene glycol di(meth)acrylate, trimethylolpropane tri(meth)acrylate, pentaerythritol tri(meth)acrylate, dipentaerythritol hexa(meth)acrylate, (meth)acrylates of alkylene oxides of polyhydric alcohols such as diols, triols, tetraols and hexaols as described above, and so on. Among them, use may be preferably made of a (meth)acrylate obtained by reacting a polyhydric alcohol with (meth)acrylic acid and having two or more (meth)acryl groups per molecule as an alcohol (meth)acrylate. Among the (meth)acrylate compounds as described above, acrylate compounds are preferred to methacrylate compounds from the viewpoint of the polymerization speed.

Examples of the urethane (meth)acrylate as described above include (meth)acrylate obtained by reacting a hydroxyl group-containing (meth)acrylic acid ester with an isocyanate compound. As the above-described hydroxyl group-containing (meth)acrylic acid ester, a hydroxyl group-containing (meth)acrylic acid ester obtained by an esterification reaction between an aliphatic dihydric alcohol with (meth)acrylic acid. Specific examples thereof include 2-hydroxyethyl (meth)acrylate and so on. As the above-described isocyanate compound, a polyisocyanate compound having two or more isocyanate groups per molecule such as tolylene diisocyanate, hexamethylene diisocyanate or isophorone diisocyanate is preferred.

Examples of the above-described polyester (meth)acrylate include polyester (meth)acrylates obtained by reacting a hydroxyl group-containing polyester with (meth)acrylic acid. Examples of the above-described polyether (meth)acrylate include polyether (meth)acrylates obtained by reacting a hydroxyl group-containing polyether with acrylic acid.

As the radical polymerization initiator in the resin composition for stereolithography according to the present invention, any polymerization initiator capable of initiating the radical polymerization of the radical-polymerizable organic compound upon irradiation with the actinic radiation can be used. Examples thereof include benzyl or its dialkyl acetal compounds, acetoxyphenone compounds, benzoin or its alkyl ether compounds, benzophenone compounds, thioxanthone compounds and so on.

More specifically speaking, examples of the benzyl or its dialkyl acetal compounds include benzyl dimethyl ketal, benzyl-β-methoxyethyl acetal, 1-hydroxycyclohexyl phenyl ketone and so on.

Examples of the acetophenone compounds include diethoxyacetophenone, 2-hydroxymethyl-1-phenylpropan-1-one, 4'-isopropyl-2-hydroxy-2-methyl-propiophenone, 2-hydroxy-2-methyl-propiophenone, p-dimethylaminoacetophenone, p-tert-butyldichloroacetophenone, p-tert-butyltrichloroacetophenone, p-azidobenzalacetophenone and so on.

Examples of the benzoin compounds include benzoin, benzoin methyl ether, benzoin ethyl ether, benzoin isopropyl ether, benzoin normal-butyl ether, benzoin isobutyl ether and so on.

Examples of the benzophenone compounds include benzophenone, methyl o-benzoylbenzoate, Michler's ketone, 4,4'-bisdiethylaminobenzophenone, 4,4'-dichlorobenzophenone and so on.

Examples of the thioxanthone compounds include thioxanthone, 2-methylthioxanthone, 2-ethylthioxanthone, 2-chlorothioxanthone, 2-isopropylthioxanthone and so on.

Either one of these radical polymerization initiators or a combination of two or more thereof may be used in the present invention depending on the desired performance.

In the resin composition for stereolithography according to the present invention, it is preferable that the content of the radical polymerization initiator ranges from 0.5 to 10% by mass, still preferably from 1 to 5% by mass, based on the total mass of the cationic-polymerizable organic compound and the radical-polymerizable organic compound.

It is preferable from the viewpoints of the viscosity of the composition, the reaction speed, the fabricating speed, the dimensional accuracy and mechanical properties of the obtained three-dimensional object and so on that the resin composition for stereolithography according to the present invention contains the cationic-polymerizable organic compound and the radical-polymerizable organic compound at the ratio by mass of the cationic-polymerizable organic compound: the radical-polymerizable organic compound of from 90:10 to 30 to 70, still preferably at a ratio by mass of from 80:20 to 40:60.

In addition to the cationic-polymerizable organic compound, radical-polymerizable organic compound, cationic polymerization initiator and radical polymerization initiator as described above, the resin composition for stereolithography according to the present invention may contain one or more oxetane compounds having oxetane group in some cases. In the case where the resin composition for stereolithography according to the present invention further contains an oxetane compound, an object by stereolithography, which is superior in resolution, fabricating accuracy, dimensional accuracy, mechanical properties and appearance, can be smoothly produced upon actinic radiation irradiation at a high fabricating speed, while sustaining favorable storage stability and aging stability during operation.

As the compound having oxetane group, use may be preferably made of, in addition to the oxetane compounds cited in the above (2) concerning the cationic-polymerizable organic compound type, at least one compound selected from among an oxetane monoalcohol compound having one or more oxetane groups and one alcoholic hydroxyl group per molecule may be cited, still preferably a compound represented by the following formula (III):

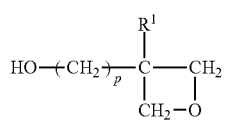

(III)

wherein $R^1$ represents an alkyl group, an aryl group or an aralkyl group; and p represents an integer of from 1 to 6; and a compound having two or more oxetane groups but having no alcoholic hydroxyl group per molecule, still preferably a compound represented by the following formula (IV):

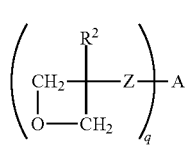

(IV)

wherein $R^2$ represents a hydrogen atom, a fluorine atom, an alkyl group, a fluoroalkyl group, an aryl group or an aralkyl group; Z represents an oxygen atom or a sulfur atom; q represents an integer of 2 or above; and A represents a divalent or higher organic group.

In the case where the active energy-curable resin composition according to the present invention contains oxetane monoalcohol, in particular, the oxetane monoalcohol represented by the above formula (III) (hereinafter sometimes referred to as "oxetane monoalcohol (III)"), it is possible to produce an object by stereolithography, which is superior in water resistance, moisture resistance, mechanical properties and dimensional accuracy, at a high reaction speed, a high fabricating speed, a high fabricating accuracy and a high productivity without lowering the cure speed upon actinic radiation irradiation even by using a compound having epoxy group as the cationic-polymerizable organic compound.

Examples of $R^1$ in the above formula (III) showing the oxetane monoalcohol (III) include alkyl groups having from 1 to 10 carbon atoms such as methyl, ethyl, propyl, butyl, pentyl, hexyl, heptyl, octyl, nonyl and decyl, aryl groups such as phenyl, tolyl, naphthyl and methylphenyl, and aralkyl groups such as benzyl and β-phenylethyl. Among them, it is preferable that $R^1$ is a lower alkyl group such as methyl, ethyl, propyl or butyl. In the above formula (III), p is an integer of from 1 to 6, preferably an integer of from 1 to 4.

Specific examples of the oxetane monoalcohol compound (III) include 3-hydroxymethyl-3-methyloxetane, 3-hydroxymethyl-3-ethyloxetane, 3-hydroxymethyl-3-propyloxetane, 3-hydroxymethyl-3-normal-butyloxetane, 3-hydroxymethyl-3-phenyloxetane, 3-hydroxymethyl-3-benzyloxetane, 3-hydroxyethyl-3-methyloxetane, 3-hydroxyethyl-3-ethyloxetane, 3-hydroxyethyl-3-propyloxetane, 3-hydroxyethyl-3-phenyloxetane, 3-hydroxypropyl-3-methyloxetane, 3-hydroxypropyl-3-ethyloxetane, 3-hydroxypropyl-3-propyloxetane, 3-hydroxypropyl-3-phenyloxetane, 3-hydroxybutyl-3-methyloxetane and so on. Either one of these compounds or two or more thereof may be used. Among them, it is preferable to use 3-hydroxymethyl-3-methyloxetane or 3-hydroxymethyl-3-ethyloxetane as the oxetane monoalcohol compound (III) from the viewpoint of availability, etc.

In the case where the resin composition for stereolithography according to the present invention contains an oxetane compound having two or more oxetane groups per molecule but having no alcoholic hydroxyl group, in particular, a compound represented by the above formula (IV) (hereinafter sometimes referred to as "polyoxetane (IV)"), the photo cured object (object by stereolithography, etc.) thus obtained has a further elevated dimensional accuracy.

In the above-described formula (IV) showing the polyoxetane (IV), examples of $R^2$ include a hydrogen atom, a fluorine atom, alkyl groups having from 1 to 10 carbon atoms such as methyl, ethyl, propyl, butyl, pentyl, hexyl, heptyl, octyl, nonyl and decyl, fluoroalkyl groups substituted by one or more fluorine atoms and having from 1 to 6 carbon atoms such as fluoromethyl, fluoroethyl, fluoropropyl, fluorobutyl, fluoropentyl and fluorohexyl, aryl groups such as phenyl, tolyl, naphthyl, and methylphenyl, aralkyl groups such as benzyl and β-phenylethyl and a furyl group. Among all, it is preferred that $R^2$ is a hydrogen atom or a lower alkyl group such as methyl, ethyl, propyl, butyl, pentyl or hexyl. It is preferred that q is an integer of from 2 to 4. The valency A is the same as the numerical value q. Examples of A include alkylene groups having from 1 to 12 carbon atoms, divalent arylene groups such as a phenylene group and a bisphenol residue, diorganopolysiloxy groups, trivalent or tetravalent hydrocarbon groups and so on.

Appropriate examples of the compound having two or more oxetane groups per molecule include 1,4-bis((3-ethyl-3-oxetanylmethoxy)methyl)benzene, 1,4-bis(3-ethyl-3-oxetanylmethoxy)butane and so on.

In the case where the resin composition for stereolithography according to the present invention contains an oxetane compound, the content of the oxetane compound (the total content of oxetane monoalcohol and polyoxetane in the case of containing both of them) preferably ranges from 0.5 to 30 parts by mass, still preferably from 1 to 28 parts by mass and still preferably from 1 to 25 parts by mass, per 100 parts by mass of the cationic-polymerizable organic compound. In the case where the oxetane monoalcohol compound (III) is contained in a too large amount in the resin composition for stereolithography, the reaction excessively proceeds and thus the molecular weight is lowered. As a result, the water resistance, moisture resistance, heat resistance, etc. of the thus obtained object by stereolithography are sometimes worsened. In the case where the oxetane compound (IV) is contained in a too large amount in the resin composition for stereolithography, the physical properties are worsened in some cases.

The resin composition for stereolithography according to the present invention may further contain a polyalkylene ether compound in some cases. Owing to the polyalkylene ether compound contained therein, the physical properties such as impact resistance can be improved.

As the polyalkylene ether compound, it is particularly preferred to use a polyalkylene ether compound represented by the following formula (V):

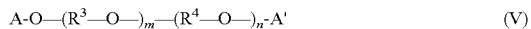

$$A-O-(R^3-O-)_m-(R^4-O-)_n-A' \quad (V)$$

wherein $R^3$ and $R^4$ are different from each other and each represents a straight-chain or branched alkylene group having from 2 to 10 carbon atoms; A and A' independently represent each a hydrogen atom, an alkyl group, a phenyl group, an acetyl group or a benzoyl group; and m and n independently represent each 0 or an integer of 1 or above (provided that both of m and n do not represent 0 at the same time).

In the case where both of m and n in the polyalkylene ether compound represented by the above formula (V) (hereinafter sometimes referred to as "polyalkylene ether compound (V)") are integers of 1 or above and the sum of m and n is 3 or above, the oxyalkylene unit (alkylene ether unit): —$R^3$—O— and the oxyalkylene unit (alkylene ether unit): —$R^4$—O— may be bonded either via random bond or via block bond. Alternatively, a mixture of random bond with block bond may be employed.

In the above-described polyalkylene ether compound (V), specific examples of $R^3$ and $R^4$ include an ethylene group, an n-propylene group, an isopropylene group, an n-butylene group (a tetramethylene group), an isobutylene group, a tert-butylene group, straight-chain or branched pentylene groups (for example, —$CH_2CH_2CH_2CH_2CH_2$— and —$CH_2CH_2CH(CH_3)CH_2$—), straight-chain or branched hexylene groups (for example, —$CH_2CH_2CH_2CH_2CH_2CH_2$—, —$CH_2CH_2CH(CH_3)CH_2CH_2$— and —$CH_2CH_2CH(C_2H_5)CH_2$—), heptylene groups, octylene groups, nonylene groups, decanylene groups and so on. Among them, it is preferred that $R^3$ and $R^4$ are any groups selected from among ethylene group, an n-propylene group, an isopropylene group, an n-butylene group (a tetramethylene group), an n-pentylene group, a branched pentylene group represented by the formula —$CH_2CH_2CH(CH_3)CH_2$—, an n-hexylene group and branched hexylene groups represented by the formula: —$CH_2CH_2CH(CH_3)CH_2CH_2$— or —$CH_2CH_2CH(C_2H_5)CH_2$—.

In the above-described polyalkylene ether compound (V), specific examples of A and A' include a hydrogen atom, a methyl group, an ethyl group, a propyl group, a butyl group, a phenyl group, an acetyl group, a benzoyl group and so on. Among them, it is preferred that at least one of A and A', in particular, both of them are hydrogen atoms. In the case where at least one of A and A' is a hydrogen atom, the hydroxyl groups at both ends of the polyalkylene ether compound react with the cationic polymerization initiator or the radical polymerization initiator upon the irradiation of the resin composition for stereolithography containing the polyalkylene ether compound with the actinic radiation. As a result, the polyalkylene ether compound is bonded in the cured resin and thus properties such as impact resistance are further improved.

In the above-described polyalkylene ether compound (V), it is preferred that m and n respectively showing the numbers of the repeating oxyalkylene units are such values as controlling the number-average molecular weight of the polyalkylene ether compound within the range of from 500 to 10,000, still preferably form 500 to 5,000.

Appropriate examples of the above-described polyalkylene ether compound (V) include polyethylene glycol, polypropylene glycol, polytetramethylene glycol, polyethylene oxide-polypropylene oxide block copolymer, ethylene oxide-propylene oxide random copolymer, a polyether comprising oxytetramethylene units having alkyl substituent (tetramethylene ether units having alkyl substituent) represented by the formula: —$CH_2CH_2CH(R^5)CH_2O$— (wherein $R^5$ represents a lower alkyl group, preferably a methyl or ethyl group) bonded together, a polyether comprising oxytetramethylene units and the above-described oxytetramethylene units having alkyl substituent represented by the formula: —$CH_2CH_2CH(R^5)CH_2O$— (wherein $R^5$ is a lower alkyl group) bonded together at random, and so on. The island components may be made of one of the above-described polyalkylene ether compounds or two or more thereof. Among them, it is preferred to use polytetramethylene glycol having a number-average molecular weight of from 500 to 10,000 as described above and/or a polyether comprising teramethylene ether units with tetramethylene ether units having alkyl substituent represented by the formula: —$CH_2CH_2CH(R^5)CH_2O$— (wherein $R^5$ is a lower alkyl group) bonded together at random, since an object by stereolithography having a low hygroscopicity and being superior in dimensional stability and physical stability can be thus obtained.

In the case where the resin composition for stereolithography according to the present invention contains a polyalkylene ether compound, the content of the polyalkylene ether compound preferably ranges from 1 to 30% by mass, still preferably from 2 to 20% by mass, based on the total mass of the resin composition for stereolithography. It may contain two or more types of polyalkylene ether compounds at the same time so long as the total content thereof does not exceed the above level.

The resin composition for stereolithography according to the present invention may contain either or both of the oxetane compound and the polyalkylene ether compound. Alternatively, it may be free from both of them.

In the case where the resin composition for stereolithography contains both of the oxetane compound and the polyalkylene ether compound, the sum of the contents thereof preferably ranges from 1 to 60 parts by mass, still preferably from 2 to 50 parts by mass and still preferably from 2 to 40 parts by mass, per 100 parts by mass of the cationic-polymerizable organic compound.

The resin composition for stereolithography according to the present invention may further contain, if desired, appropriate amount of one or more additives, for example, a coloring agent such as a pigment or a dye, a defoaming agent, a leveling agent, a thickener, a flame retardant, an antioxidant, a filler (silica, glass powder, ceramic powder, metal powder and so on), a resin for modification and so on, so long as the advantages of the present invention are not worsened thereby.

In the stereolithography with the use of the resin composition for stereolithography according to the present invention, use may be made of any known stereolithography method and apparatus. As a typical example of preferably usable stereolithography methods, citation may be made of a method which comprises selectively irradiating the resin composition for stereolithography according to the present invention in a liquid state with an actinic radiation in such a manner as giving a cured resin layer having a desired shape pattern to thereby form a cured layer, then providing the uncured resin composition for stereolithography in a liquid state corresponding to a single layer on the above-described cured resin layer, irradiating with the actinic radiation to newly form a cured resin layer having continued with the above-described cured layer, and repeating this piling up procedure to finally give a desired three-dimensional object. Examples of the actinic radiation to be used in the above method include actinic radiations such as ultraviolet ray, electron beam, X-ray, radial ray and so on, as described above. Among them, ultraviolet ray having a wavelength of from 300 to 400 nm is preferably employed from the economical viewpoint. As the light source therefor, use can be made of an ultraviolet laser (for example, Ar laser, He—Cd laser or the like), a mercury lamp, a xenon lamp, a halogen lamp, a fluorescent lamp and so on. Among them, a laser source is preferably employed, since it can elevate the energy level so as to shorten the fabricating time and, moreover, establishes a high fabricating accuracy owing to its superior focusing ability.

Although the application fields wherein the resin composition for stereolithography according to the present invention is usable are not particularly restricted, typical examples thereof include a model for examining the appearance mode in the course of design, a model for checking the function of a part, a matrix die for constructing a template, a base model for constructing a metallic die, a direct die for trial construction of a metallic die and so on. The resin composition for stereolithography according to the present invention is particularly effective in constructing a model of a delicate part. More specifically speaking, it can be effectively usable as models of delicate parts, electric and electronic parts, furniture, architectural constructs, automobile parts, various containers, template and so on, matrices, processing members and so on.

EXAMPLES

Now, the present invention will be described in greater detail by reference to the following EXAMPLES. However, it is to be understood that the invention is not restricted to these EXAMPLES. In these EXAMPLES, all "parts" are by mass. In the following EXAMPLES, the viscosity of a resin composition for stereolithography was measured as follows.
(Measurement of Viscosity of Resin Composition for Stereolithography)

After putting a resin composition for stereolithography for viscosity measurement into a thermostat at 25° C. and adjusting the temperature of the resin composition for stereolithography to 25° C., the viscosity was measured by using a B type viscometer (manufactured by Tokyo Keiki Co., Ltd.).

Production Example 1

(1) Into a 100 ml reactor were supplied 5.86 g (21.3 mmol) of potassium hexafluoroantimonate and 10 ml of acetonitrile. After mixing with stirring, 2.13 g (21.3 mmol) of conc. sulfuric acid was added thereto followed by stirring for 30 minutes.

To the obtained solution, a solution containing 4.05 g (20.0 mmol) of diphenyl sulfoxide and 5.94 g (58.2 mmol) of acetonitrile anhydride having been homogeneously dissolved homogeneously was added at room temperature. Next, 3.61 g (19.4 mmol) of diphenyl sulfide was dropped thereinto and the obtained mixture was stirred at 40° C. for 2 hours. After cooling this liquid reaction mixture to room temperature, 20 ml of dichloromethane and 20 ml of water were added and dissolved followed by washing and separation. The organic layer was further washed thrice with 10 ml portions of water. Then dichloromethane and acetonitrile were distilled off to give 11.3 g of a somewhat yellowish solid product (yield: 96%).

(2) The solid product obtained above was analyzed by $^{13}$C-NMR, IR and HPLC. Thus, it was found out that this product comprised (4-phenylthiophenyl)diphenylsulfonium hexafluoroantimonate (the compound of the above formula (I) wherein M is an antimony atom) and contained, as impurities, diphenyl sulfide and diphenyl sulfoxide employed as the starting materials and bis-(4-(diphenylsulfonio)phenyl) sulfide bishexafluoroantimonate (the compound of the above formula (II) wherein M is an antimony atom). The purity was 95%.

(3) 40 ml of ethanol was added to the solid product obtained in the above (1). After heating to 50° C. to thereby dissolve the solid, the solution was cooled to 20° C. or lower for crystallization. The precipitate was filtered, separated and dried to give 9.23 g of a white powder (purified product). The purity was 98%.

Example 1

(1) 1,500 parts of 3,4-epoxycyclohexylmethyl-3,4-epoxycyclohexane carboxylate, 500 parts of bisphenol A bis(propylene glycol glycidyl ether) ether ("RIKA RESIN BPO-20E" manufactured by New Japan Chemical Co., Ltd.) 500 parts of 2,2-bis(4-(acryloxydiethoxy)phenyl)propane ("NK ESTER A-BPE-4" manufactured by Shin-Nakamura Chemical Co., Ltd.), 400 parts of propylene oxide-denatured trimethylolpropane triacrylate ("ATM-4P" manufactured by Shin-Nakamura Chemical Co., Ltd.), 300 parts of dicyclopentadienyl diacrylate ("A-DCP" manufactured by Shin-Nakamura Chemical Co., Ltd.) and 300 parts of 3-methyl-3-hydroxymethyloxetane were mixed together and stirred at 20 to 25° C. for about 1 hour to prepare a mixture containing a cationic-polymerizable organic compound, a radical-polymerizable organic compound and an oxetane monoalcohol (total mass of the mixture: 3,500 parts).

(2) 100 parts of the (4-thiophenyl)diphenylsulfonium hexafluoroantimonate (the compound of the above formula (I) wherein M is an antimony atom) having a purity of 98% as obtained in the PRODUCTION EXAMPLE 1 was dissolved in 100 parts of propylene carbonate to give a photo cationic polymerization initiator solution.

(3) Under blocking ultraviolet light, 45 parts of 1-hydroxycyclohexyl phenyl ketone ("Irgacure 184" manufactured by Ciba Specialty Chemicals) as a photo radical polymerization initiator and 90 parts of a solution for photo cationic polymerization initiator prepared in the above (2) were added to the whole mixture (3,500 parts) obtained in the above (1). The obtained mixture was mixed under stirring at 25° C. for about 1 hour until it was completely dissolved to thereby give a resin composition for stereolithography. The viscosity of this resin composition for stereolithography at 25° C. was 300 mPa·s.

(4) A portion of the resin composition for stereolithography obtained in the above (1) was sampled, put into a container and stored in a thermostat at 80° C. while blocking ultraviolet light to thereby examine the viscosity stability. As a result, little increase in viscosity was observed until the day 30 (viscosity on the day 30: 316 mPa·s at 25° C.). The viscosity on the day 50 was 330 mPa·s (25° C.). Although the viscosity was somewhat increased on the day 60, it caused no trouble in fabricating and thus fabricating could be carried out without any problem. When heating at the same temperature (80° C.) was continued thereafter, stirring became impossible on the day 74.

(5) By using the resin composition for stereolithography obtained in the above (3), a dumbbell-shaped test piece in accordance with JIS K7113 was produced by stereplithography with the use of an ultrahigh optically molding system ("SOLIFORM 500C" manufactured by Teijin Seiki) upon irradiation with a semiconductor laser (power 175 mW, wavelength 355 nm) at an irradiation energy of 20 to 30 mJ/cm$^2$, a slice pitch (layer thickness) of 0.10 mm and an average fabricating time per layer of 2 minutes.

(6) When the test piece obtained in the above (5) was observed with the naked eye, it was a well-fabricated object without any deviation. Then the tensile properties (tensile strength, tensile elongation, and tensile modulus) and flexural properties (flexural strength and flexural modulus) of the test piece obtained in the above (5) were measured in accordance with JIS K7113. Table 1 shows the results.

Comparative Example 1

(1) The procedure of EXAMPLE 1 (1) was followed to give a mixture containing the cationic-polymerizable organic compound, the radical-polymerizable organic compound and monohydroxyoxane (total mass of the mixture: 3,500 parts).

(2) To the whole mixture (3,500 parts) obtained above were added 45 parts of 1-hydroxycyclohexyl phenyl ketone as the same photo radical polymerization inhibitor as employed in EXAMPLE 1 and 90 parts of a marketed photo cation initiator ("UVI-6974" manufactured by Dow Chemical Japan Ltd.) (100 parts of a solid mixture of (bis-(4-diphenylsulfonio) phenyl)sulfide bishexafluoroantimonate with (4-phenythiophenyl)diphenylsulfonium hexafluoroantimonate at a mass ratio of 2:2 having been dissolved in 100 parts of propylene carbonate) and mixed under stirring at a temperature of 25° C. for about 1 hour until the additives were completely dissolved, thereby giving a resin composition for stereolithography. The viscosity of this resin composition for stereolithography at 25° C. was 310 mPa·s.

(3) A portion of the resin composition for stereolithography obtained in the above (2) was sampled, put into a container and stored in a thermostat at 80° C. while blocking ultraviolet light to thereby examine the viscosity stability. As a result, the viscosity was rapidly increased on the day 2 (viscosity at 25° C.: 8230 mPa·s) and stirring became impossible on the day 4.

(4) By using the resin composition for stereolithography obtained in the above (2), a dumbbell-shaped test piece (an object by stereolithography) in accordance with JIS K7113 was produced by stereolithography with the use of the same ultrahigh optically molding system as in EXAMPLE 1 (5).

(5) The tensile properties (tensile strength, tensile elongation, and tensile modulus) and flexural properties (flexural strength and flexural modulus) of the test piece obtained in the above (4) were measured in accordance with JIS K7113. Table 1 shows the results.

Example 2

(1) 1,800 parts of 3,4-epoxycyclohexylmethyl-3,4-epoxycyclohexane carboxylate, 500 parts of bisphenol 2,2-bis(4-(acryloxydiethoxy)-phenyl)propane ("NK ESTER A-BPE-4" manufactured by Shin-Nakamura Chemical Co., Ltd.; having 4 mol of ethylene oxide unit added), 300 parts of propylene oxide-denatured pentaerythritol tetraacrylate ("ATM-4P" manufactured by Shin-Nakamura Chemical Co., Ltd.), 300 parts of 3-methyl-3-hydroxymethyloxetane and 300 parts of polytetramethylene glycol (number-average molecular weight: 2,000) were mixed together and stirred at 20 to 25° C. for about 1 hour to prepare a mixture (total mass of the mixture: 3,200 parts).

(2) 100 parts of the (4-thiophenyl)diphenylsulfonium hexafluoroantimonate (the compound of the above formula (I) wherein M is an antimony atom) having a purity of 98% as obtained in the PRODUCTION EXAMPLE 1 was dissolved in 100 parts of propylene carbonate to give a solution for a photo cationic polymerization initiator.

(3) Under blocking ultraviolet light, 60 parts of a photo radical polymerization initiator 1-hydroxy-cyclohexyl phenyl ketone ("Irgacure 184" manufactured by Ciba Specialty Chemicals) and 90 parts of a solution for photo cationic polymerization initiator prepared in the above (2) were added to the mixture obtained in the above (1). The obtained mixture was mixed under stirring at 25° C. for about 1 hour until it was completely dissolved to thereby give a resin composition for stereolithography. The viscosity of this resin composition for stereolithography at 25° C. was 368 mPa·s.

(4) A portion of the resin composition for stereolithography obtained in the above (1) was sampled, put into a container and stored in a thermostat at 80° C. while blocking ultraviolet light to thereby examine the viscosity stability. As a result, little increase in viscosity was observed until the day 30 (viscosity on the day 30: 406 mPa·s at 25° C.) and thus fabricating could be carried out without any problem. When heating at the same temperature (80° C.) was continued thereafter, stirring became impossible on the day 70.

(5) By using the resin composition for stereolithography obtained in the above (3), a dumbbell-shaped test piece (an object by stereolithography) in accordance with JIS K7113 was produced by optically three-dimensional molding with the use of an ultrahigh optically molding system ("SOLIFORM 500C" manufactured by Teijin Seiki) upon irradiation with a semiconductor laser (power 175 mW, wavelength 355 nm) at an irradiation energy of 20 to 30 mJ/cm$^2$, a slice pitch (layer thickness) of 0.10 mm and an average fabricating time per layer of 2 minutes.

(6) When the test piece obtained in the above (5) was observed with the naked eye, it was a well-fabricated object without any deviation. Then the tensile properties (tensile strength, tensile elongation, and tensile modulus) and flexural properties (flexural strength and flexural modulus) of the test piece obtained in the above (5) were measured in accordance with JIS K7113. Table 1 shows the results.

Comparative Example 2

(1) The procedure of EXAMPLE 2 (1) was followed to give a mixture containing the cationic-polymerizable organic compound, the radical-polymerizable organic compound and oxane monoalcohol and polytetramethylene glycol (total mass of the mixture: 3,200 parts).

(2) To the whole mixture (3,200 parts) obtained above were added 45 parts of 1-hydroxycyclohexyl phenyl ketone as the same photo radical polymerization inhibitor as employed in EXAMPLE 1 and 90 parts of the same marketed photo cation initiator ("UVI-6974" manufactured by Dow Chemical Japan Ltd.) as employed in COMPARATIVE EXAMPLE 1 and mixed under stirring at a temperature of 25° C. for about 1 hour until the additives were completely dissolved, thereby giving a resin composition for stereolithography. The viscosity of this resin composition for stereolithography at 25° C. was 396 mPa·s.

(3) A portion of the resin composition for stereolithography obtained in the above (2) was sampled, put into a container and stored in a thermostat at 80° C. while blocking ultraviolet light to thereby examine the viscosity stability. As a result, the viscosity was rapidly increased on the day 2 (viscosity at 25° C.: 8680 mPa·s) and stirring became impossible on the day 4.

(4) By using the resin composition for stereolithography obtained in the above (2), a dumbbell-shaped test piece (an object by stereolithography) in accordance with JIS K7113 was produced by stereolithography with the use of the same ultrahigh optically molding system as in EXAMPLE 1 (5).

(5) The tensile properties (tensile strength, tensile elongation, and tensile modulus) and flexural properties (flexural strength and flexural modulus) of the test piece obtained in the above (4) were measured in accordance with JIS K7113. Table 1 shows the results.

TABLE 1

|  | Ex. 1 | Comparative Ex. 1 | EX. 2 | Comparative EX. 2 |
|---|---|---|---|---|
| (Storage stability) | | | | |
| Starting of increase in viscosity (day) | >30 days[1] | Day 2 | >30 days[1] | Day 2 |
| Inability to stir (day) | Day 74 | Day 4 | Day 70 | Day 4 |
| Mechanical properties | | | | |
| Tensile strength (MPa) | 61 | 60 | 54 | 45 |
| Tensile modulus (MPa) | 2100 | 2000 | 1900 | 1700 |
| Tensile elongation (%) | 5.4 | 6.0 | 11.1 | 11.9 |
| Flexural strength (MPa) | 73 | 70 | 66 | 66 |
| Flexural modulus (MPa) | 2770 | 2500 | 2120 | 1990 |
| Color of photo cured object | Pale yellow & transparent | Pale yellow & transparent | Slightly cloudy | Slightly cloudy |
| Appearance of photo cured object | Good | Good | Good | good |

[1] Little increase in viscosity was observed on the day 30.

As the results shown in the above Table 1 indicate, the resin compositions for stereolithography of EXAMPLES 1 and 2, each containing a cationic-polymerizable organic compound, a radical-polymerizable organic compound, a cationic polymerization initiator and a radical polymerization initiator, showed little increase in viscosity even after storing at a high temperature 80° C. for a long period of time, i.e., showing a high storage stability, and quickly cured molding due to the actinic radiation irradiation to smoothly give an object by stereolithography having superior mechanical properties, appearance and color tone, owing to (4-thiophenylphenyl)diphenylsulfonium hexafluoroantimonate having a purity of 80% or higher employed as the cationic polymerization initiator therein.

In the case of the resin compositions for stereolithography of COMPARATIVE EXAMPLES 1 and 2, each containing a cationic-polymerizable organic compound, a radical-polymerizable organic compound, a cationic polymerization initiator and a radical polymerization initiator, in contrast thereto, the viscosity began to increase after 2 days under heating to 80° C. and stirring became impossible after 4 days due to the excessively high viscosity and stereolithography could not be performed any longer, owing to the marketed cationic polymerization initiator (a mixture of (bis-(4-diphenylsulfonio)phenyl)sulfide bishexafluoroantimonate with (4-thiophenylphenyl)diphenylsulfonium hexafluoroantimonate at a mass ratio of 2:2) containing a large amount of bis-(4-diphenylsulfonio)phenyl)sulfide bishexafluoroantimonate which was employed as the cationic polymerization initiator therein.

While the present invention has been described above in detail by referring specific embodiments thereof, it is obvious for those skilled in the art that various changes and modifications can be made without departing from the spirit and scope of the invention.

The present application is based on Japanese Patent Application filed on Jun. 25, 2003 (Japanese Patent Application 2003-180470), the contents of which is incorporated by reference.

INDUSTRIAL APPLICABILITY

Although the application fields of the resin composition for stereolithography according to the present invention are not particularly restricted, typical examples of the application thereof include products for practical use such as a model for examining the appearance mode in the course of design, a model for checking the function of a part, a matrix die for constructing a template, a base model for constructing a metallic die, a direct die for trial construction of a metallic die and so on. The resin composition for stereolithography can be effectively usable as models of delicate parts, electric and electronic parts, furniture, architectural constructs, automobile parts, various containers, template and so on, matrices, processing members and so on.

The invention claimed is:

1. A resin composition for stereolithography, which is an actinic radiation-curable resin composition comprising:

a cationic-polymerizable organic compound comprising at least one compound having an epoxy group;

a radical-polymerizable organic compound comprising at least one compound having a (meth)acryl group;

a photo initiator for cationic polymerization; and an ultraviolet light-sensitive photo initiator for radical polymerization, wherein the photo initiator for cationic polymerization comprises a compound represented by the following formula (I), the compound having a purity of 95% or higher and containing 5% by mass or less of a compound represented by the following formula (II):

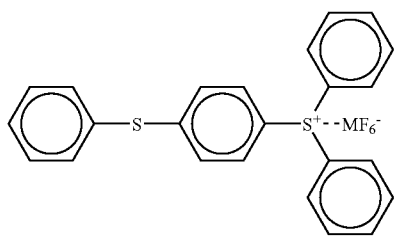

(I)

wherein M represents an antimony atom; and the broken line between S⁺ and MF₆⁻ represents an ionic bond, and wherein the photo initiator for cationic polymerization is the only component in the composition dissolved or dispersed in propylene carbonate or ethylene carbonate prior to being combined with the other components to form the resin composition.

2. The resin composition for stereolithography as claimed in claim 1, which comprises an oxetane compound at a ratio of from 1 to 30% by mass with respect to the mass of the cationic-polymerizable organic compound.

3. The resin composition for stereolithography as claimed in claim 1, which comprises a polyalkylene ether compound at a ratio of from 1 to 30% by mass with respect to the mass of the cationic-polymerizable organic compound.

4. The resin composition for stereolithography as claimed in claim 1, wherein the photo initiator for cationic polymerization contains substantially no compound represented by formula (II).

* * * * *